United States Patent [19]

Neary et al.

[11] 4,414,082

[45] Nov. 8, 1983

[54] PROCESS FOR CRACKING HYDROCARBONS

[76] Inventors: Michael P. Neary, 409 E. Coronado #2, Sante Fe, N. Mex. 87501; Thomas A. Wilson, 14 Bayview Ct., Manhasset, N.Y. 11030

[21] Appl. No.: 321,396

[22] Filed: Nov. 16, 1981

Related U.S. Application Data

[60] Continuation-in-part of Ser. No. 962,770, Nov. 21, 1978, abandoned, which is a division of Ser. No. 213,039, Dec. 4, 1980, Pat. No. 4,335,160.

[51] Int. Cl.$^3$ .............................................. C07C 3/24
[52] U.S. Cl. ................................. 204/162 R; 585/752
[58] Field of Search .................... 204/162 R; 585/721, 585/752

[56] References Cited

U.S. PATENT DOCUMENTS 3,711,568  1/1973  Cooper ................................. 585/752

Primary Examiner—Leland A. Sebastian

[57] ABSTRACT

This invention relates to a new manner of carrying out chemical reactions by injection of selected forms of energy into the reaction zone by novel means. By applying this principal, many new processes result with application in a large number of different industries. The new process is generally capable of operation at room temperatures, which has advantages in the creation of certain sensitive products including uniformly doped semiconductors, new catalysts, pure gases, high purity materials of any kind, controlled coatings, new polymers, combustion enhancement, difficult separation, petroleum refinery operations, and carrying out any reaction in which the injection of specific energy types is helpful.

1 Claim, No Drawings

PROCESS FOR CRACKING HYDROCARBONS

This application is a continuation-in-part of copending application Ser. No. 962,770 filed Nov. 21, 1978, now abandoned and is a division of copending application Ser. No. 213,039 filed Dec. 4,1980, now U.S. Pat. No. 4,335,160.

This invention relates to a new manner of carrying out chemical reactions by inception of selected forms of energy into the reaction zone by novel means. By applying this principal, many new processes result with application in a large number of different industries. The new process is generally capable of operation at room temperatures, which has advantages in the creation of certain sensitive products including uniformly doped semiconductors, new catalysts, pure gases, high purity materials of any kind, controlled coatings, new polymers, combustion enhancement, difficult separation, petroleum refinery operations, and carrying out any reaction in which the injection of specific energy types is helpful.

A particular instance is a method for producing coatings of selected metals, non-metals and other molecules. Multiple layer coatings may be formed with virtually any combination of materials. The purity of the material of each layer may be as high as 100% and the thickness of each layer can be controlled to a single atomic or molecular layer.

Heretofore, it has been impossible to produce bodies or deposits of metals, non-metals, crystals and substances generally, and achieve a purity of approximately 100%, particularly when the processes involved are carried out at ambient temperatures. Similarly, it has been found to be impossible to dope said bodies at ambient temperatures since doping has required diffusion, and high temperatures have been needed to permit diffusion of the dopant into the body. For instance, ultra pure silicon must be heated to dope it by diffusion methods. The heating, however, for this purpose, causes imperfections in the crystalline silicon causing large numbers of rejects.

An object of the invention is a new and improved means for carrying out a chemical process.

A further object envisions new and improved chemical processes involving injection of selected energy forms by novel means.

Another object is new and improved products created by such a process.

Still further objects will be appreciated from the following detailed description of the invention.

The present invention comprises forming a metastable reagent gas, intermingling said reagent gas with a sample gas causing the latter to be energized by neutral atoms of molecules in an excited state, selectively ionizing said energized sample gas by introducing additional energy in an amount corresponding to the difference between that of the excited and ionized state of said sample gas, imposing and electrical or magnetic force on said ions to remove them from the gas stream as stable atoms, in segregated zone, such as by depositing them on a substrate or in a container separate from the main stream of gas. The additional energy can be added by various means, such as a light source of the laser type, or by hollow electrodes, magnetic or electric charges, or the like.

The invention has a myriad of uses for products or processes in many different industries, many of which are discussed in this Application.

Referring to the invention in greater detail, it embodies the following principles:

1. It is possible to generate large numbers (Ca $10^8$–$10^{14}$/Sec) of so-called metastable atoms and/or molecules by passing neutral or ionized ground state atoms or molecules in the gas phase through a 200 to 300 volt potential. Optimum metastable production usually occurs when the reagent gas (i.e. the atoms or molecules from which the metastable atoms or molecules are formed) is at low pressure such as 1 to 5 torr. An atom, molecule or ion is said to be metastable when it possesses excess energy over its ground energy state and when it tends to be slow to dissipate its excess energy by radiative processes. The excess energy possessed by a metastable is usually transferred in part or completely during inelastic collisions.

2. Due to the relatively long life time of metastables, they can be easily brought into contact with metal, non-metal or moleculars in the gas phase so that through inelastic collisions the excess energy of the metastable reagent gas is transferred to them. The metal, non-metal and/or molecules thus energized may become: a neutral atom or molecule in the excited state or an ionized species.

3. Neutral atoms or molecules in excited states (i.e. with excess energy) may be further excited to the point where an electron is ejected (thus forming the atomic or molecular ion) by supplying more energy in an amount corresponding to the energy difference between the ionized and excited states of the species of interest. It is often the case that the energy difference is small and can be supplied by a light source (such as a dye laser etc.) that emits in the ultra-violet and visible portion of the electromagnetic spectrum. That is, by irradiating a collection a neutral atoms or molecules in the same excited state (i.e. the same amount of excess energy) with monochromatic radiation whose energy corresponds exactly to the energy difference between the excited and ionized states, only those atoms or molecules will be ionized.

Because of the uniqueness of the energy difference between an excited state of a particular atom or molecule and its ionized state, nearly absolute selectivity is achived. It is often the case that the energy difference referred to above can be altered by using a different reagent gas because each reagent gas is composed of metastable atoms or molecules whose energy is different from one reagent gas to another. For example, the characteristic metastable energy for some selected reagent gases is as follows: helium ($2^3S$) 19.7 eV, argon ($3^3P_{0,2}$) 11.7 eV and nitrogen ($^3\epsilon^+_u$) 6.1 eV. An added degree of selectivity can be attained by using a reagent gas whose metastable energy differs from the ionization energy of the metal, non-metal or molecule of interest by an amount such that ionization of any other material but that of interest is not possible!

4. Ions thus produced are charged particles (by definition) and therefore can be caused to move in a particular desired direction and accumulate, as a thin, uniform film, at a particular desired location by imposition of an electric or magnetic field. Furthermore by proper selection of the shape of the imposed field, mass discrimination can be achieved although it is rarely necessary with this technique.

In summary, the invention is described as follows: a flow of argon (2000 μmoles/run) is established in a soft vacuum (1-5 torr). The argon ($^3P_{0,2}$) metastable states 11.7 eV is generated in large quantities $10^8$–$10^{13}$/sec. as the argon is passed through two annular electrodes across which 200-300 Vdc is applied. These argon metastable atoms referred to as the reagent gas are brought into contact with a molecule of interest referred to as the sample gas (i.e. $W(CO)_6$, $Ni(CO)_6$ silanes, perfluoro butane, etc, where the argon metastable reagent gas transfers its excess energy to the sample gas. Many complex reactions proceed in such an energy rich environment, however, a dominant one is the formation of the metal, non-metal or molecule in a neutral, high energy state and still in the gas phase. The output from a nitrogen-laser-pumped pulsed tunable dye laser is set to the wavelength corresponding to the exact energy necessary to cause ionization of the sample gas given the energy of its neutral high energy state. The configuration of the cavity or container in which the above occurs is such that an electric or magnetic field can be applied so as to couple the site of formation of the ions of interest to the site of their deposition without entraining other non-ionic products present in the reaction zone. The layers thus deposited on a suitable target may be controlled in thickenss to an atomic or molecular layer by controlling the rate at which sample ions are formed. Layers of known uniform thickness of metals, non-metals and molecules can be deposited in any order thus giving "sandwich" type layers.

Alternatively, two or more metals could be deposited simultaneously thus forming an "alloy" like layer. Or other molecules such as monomers can be deposited as ions on a surface such that polymerization occurs. And certain chemical reaction known to proceed by way of an ion can be caused at a specific location and at a specific controlled rate.

The invention may be more readily understood by referring to the following detailed examples:

Five examples of the foregoing process will be presented. The first will deal with the non-metal silicon and the second with the metal tungsten.

EXAMPLE 1

By passing a 2000 micromole/minute flowing stream of Helium gas past electrodes across which 200 vdc are imposed, from $10^3$ to $10^{14}$ metastable Helium atoms (in the $2^3S$ state) are formed. If a volatile silicon compound such as silane is mixed into the stream of Helium metastable atoms, by a collisional process, the metastable energy is transferred to the silane forming neutral silicon atoms in the excited state. The difference in energy between the excited neutral atom and the ionic form of the atom is 3.18 eV which is equivalent to the energy of light whose wave length is 390.53 nanometers (nm). Thus if light whose wavelength is 390.53 nm is incident on the neutral excited silicon atoms, they will absorb the incident light and in doing so become ionized. By imposing either an electric or magnetic field graient between the ions and a suitable target, the ions and only the ions, will migrate to the target where they take on an electron and are deposited uniformly as ground state neutral atoms.

EXAMPLE 2

As for the example dealing with a metal, tungsten will be considered. The same procedure (as described above in the case of silicon) is used for the metal tungsten. The volatile tungsten compond used is tungsten hexacarbonyl $W(CO)_6$. Neutral excited tungsten atoms are formed in a manner similar to that for silicon. The difference in energy between the neutral excited tungsten atom and its ionic form is 2.54 eV which is equivalent to the energy of light whose wavelength is 489.73 nm. Thus, if light whose wavelength is 489.73 nm is incident on the neutral excited tungsten atoms, they will absorb the incident light and in doing so become ionized. As before, an electric or magnetic field gradient will cause the migration of the ions to the target where they pick up an electron and are deposited uniformly on the target surface as neutral tungsten atoms in the ground state. Table 1 summarizes the energy relationship described or referred to above.

(Any suitable target may be used, whether it be metal, non-metal, inorganic or organic substances. A suitable example target for examples 1 and 2 is a quartz plate).

EXAMPLE 3

P-N JUNCTION—PHOTOVOLTAIC CELL

The following example is a principle application of the invention.

Photovoltaic cells used as a means of generating electric power have come under intense investigation in recent years due to the necessity of generating electric power in remote places such as space. In the past, use of photovoltaic cell for power production has been very expensive (i.e. up to $175,000/kilowatt). The high cost cited was the result of the necessity of employing very complicated and costly fabrication procedures so that the device could be made at all. Even so, the rejection rate was as great as 90%. With interest in photovoltaic cells expanding to include commercial use to provide a power source alternative to fossil fuels, any reduction in cost of producing photovoltaic cell would further current goals.

The example discussed below will consider a photovoltaic cell based on a silicon matrix where the P layer is silicon doped with antimony and arsenic or phosphorous. The P and N layers are formed so that a sandwich configuration results.

TABLE 1

|  |  | Å | nm | Kcal | eV | K cal | eV |
|---|---|---|---|---|---|---|---|
| Non-metal | Si° | 2506.9 | 250.69 | 114.1 | 4.95 | — | — |
|  | Si+ | 1526.8 | 152.68 | 187.3 | 8.12 | — | — |
| energy difference between excited neutral atom and its ionized form |  | 3905.3 | 390.53 | — | — | 73.2 | 3.18 |
| Metal | W° | 4008.8 | 400.9 | 71.3 | 3.09 | — | — |
|  | W+ | 2204.5 | 220.5 | 129.7 | 5.63 | — | — |
| energy difference between excited neutral atom and its ionized form |  | 4897.3 | 389.7 | — | — | 58.4 | 2.54 |

It will be appreciated that the application of the principle of the invention will produce P-N junction devices (photovoltaic cells, etc.) in a manner that:
(1) is carried out at ambient (room) temperatures and thus eliminates the use of the high temperature induction furnaces presently required by current processes,
(2) the doping process is carried out continuously and in a precisely controlled manner at ambient temperatures resulting in concentrations of dopant at the bottom of the silicon layer that is equal to that found at any other depth in the layer, and thus eliminates the normal non-linear diffusion of the dopant as a function of depth that always results from the high-temperature diffusion process currently used, (3) permits the formation of a P-N junction device with layer thickness, dopant type and dopant concentration controlled remotely so that the substrate, (the surface to which the photovoltaic cell is connected) once mounted, is not handled or otherwise physically removed from the apparatus employed for the deposition of the P-N junction material.

In this example, for illustrative purposes, the N dopant will be boron and the P dopants will be antimony and phosphorous. Because these dopants were selected it is not implied that other dopants could not be employed in exactly the same manner, that is, by the application of the principle of the invention. This example differs from the previous one as follows: in the previous example the manner in which a metal or non-metal could be purified to very high levels of purity was presented; however in the example below, the means by which a controlled amount of a specific impurity and no other can be incorporated into a high purity matrix where the amount of specific impurity may be very small, is discussed, (down to parts per 100 trillion).

The source of silicon is picked from the wide variety and large number of volatile silicon compounds such as tetramethyl silicon. The volatile compounds are selected because they have high vapor pressures or readily form gases at room temperature.

An amount of the silicon compound equivalent to one or two grams of silicon is plced in a closed vessel that can:

(1) have its temperature controlled to within ±0.01° C. from 100° C. to −200° C.,
(2) be connected to a manifold through a metering valve.

The valve is initially closed so that the gas-solid in the vessel can be brought into thermal equilibrium with the vessel. The temperature controller is adjusted to the temperature that will result in the desired pressure for the gaseous silicon compound, tetra methyl silicon (TMS), for example 27° C. will result in a gaseous TMS pressure of approximately 150 mm of Hg.

The source of boron is picked from a large number of boron containing compounds, such as the hydrides and diborane, that are volatile. The volatile compounds are selected because they have high vapor pressures or readily form gases at room temperature. An amount of diborane equivalent to one or two milligrams of boron is placed in a closed vessel with characteristics similar to the vessel containing the silicon compound; and the boron containing vessel is connected to the same manifold so that the two gases can be mixed as required. Because the amount of dopant is usually very small, parts per billion or less, relative to the silicon, the low temperature capabilities of the boron containing vessel must be employed. That is by maintaining the temperature at approximately 165° C. a vapor pressure of approximately 1 to 2 mm of Hg results. Therefore, if the two gases, TMS and diborane were allowed to mix freely in the manifold at their respective vapor pressures, the diborane would be approximately 1 parts per trillion with respect to TMS. In order to reduce the concentration of diborane further it is useful to use the metering valves that separate each vessel from the manifold and apply in a soft vacuum to the manifold. In this way arbitrarily low concentrations of borane can be achieved in the flowing mixture of the two gases. The soft vacuum applied to the manifold provides the driving force or means to transfer the gas mixtures to other locations within the apparatus.

As above (i.e. in the previous example) a gas such as helium is selected for the purpose of forming a reactant gas. It will be recalled that by passing approximately 2 mols/minute of helium through a conduit such as glass tubing that at some convenient point has two annular electrodes around the outer surface of the conduit separated by 3 to 5 centimeter with 200 Vdc imposed across them, energetic or excited neutral atoms of helium will be formed. These neutral excited atoms are referred to as the metastable gas or reactant gas.

The manifold into which the TMS and borane gases are allowed to flow is connected to the glass tubing or conduit in which the metastable gas is formed in such a way that the TMS and borane gas mixture flows into the metastable gas where energy is transferred from the metastable atoms (neutral excited atoms) to TMS and diborane. This configuration is selected (instead of the one in which both the TMS and diborane gas mixture and the helium mix prior to the formation of the reactant or metastable gas) so that silicon and boron ions are not formed prior to irradiation with light whose wavelength(s) correspond(s) to energy(ies) equal to that (those) required to ionize silicon and boron from their neutral excited states. The reason being that by avoiding indiscriminate ionization very high purity levels can be achieved as well as high coating rates. It is noted, however, that under some circumstances it might be useful to form ions of either the dopant or silicon by mixing with the hilium prior to the formation of the metastable gas—namely when; the need or desire to eliminate the use of one light surce such as a laser exists, and/or lower standards of purity can be tolerated but higher coating rates necessary. However, in this example that case shall not be considered in detail. In either case though, when energy is transferred from the metastable gas to the TMS and diborane, the excited neutral silicon and boron atoms are formed. Table 2 summarizes the energy content of the most prominent excited neutral states and ionized states of silicon, boron, phosphorous, antimony and arsenic. Included in the table are the various energy difference between the excited neutral and ionized states of the elements mentioned.

At this point, the gas containing the neutral excited silicon and boron can be passed through an electric and/or magnetic field in order to remove unwanted ions that may be formed during energy transfer from the metastable gas, such as impurities whose ionization energy is less than silicon and boron. This procedure results in very high purity of the gas stream. In fact in order to achieve the highest purity a gas such as helium is selected because of its large energy content in the metastable state approximately 21 eV, thus causing efficient ionization of impurities (with low ionization energy and inefficient ionization of atoms or molecules with high ionization energies.)

The gas containing the silicon and boron atoms in their excited neutral states, in then irradiated by intense light from a source such as a hollow cathode lamp or a laser (tunable dye type for example). The light should be monochromatic (or nearly so) with a wavelength of 3247.774 Angstroms (Å) or 3.818 electron volts (eV). Either a single pass or multiple pass configuration of the light path through the gas can be employed depending on: the intrinsic intensity of the light source and the concentration of neutral excited silicon and boron atoms. A multiple pass optical configuration is preferred.

When the neutral excited silicon and boron absorb light of this wavelength the respective ions are formed because light whose wavelength is 3247.774 Å meets the ionization energy requirements of silicon in its most long lived neutral state and exceeds that required by boron in its most long lived neutral state.

The ions thus formed while still in the moving gas stream are passed through an electric and/or magnetic field and the ions are diverted from the stream (by their interaction with the field) and directed thereby to a suitable surface for coating.

TABLE 2

| Element & State | State Energy | | Energy Difference between neutral & ionized states | |
|---|---|---|---|---|
| | Å | eV | eV | Å |
| Matrix | | | | |
| Silicon: | | | | |
| neutral | 2881.578 | 4.303 | | |
| ionized | 1533.550 | 8.121 | | |
| | | | 3.818 | 3247.774 |
| P Layer Dopant | | | | |
| Boron: | | | | |
| neutral | 2497.733 | 4.965 | | |
| ionized | 1362.460 | 8.296 | | |
| | | | 3.331 | 3722.606 |
| N Layer Dopants | | | | |
| Antimony: | | | | |
| neutral | 2060.380 | 5.995 | | |
| ionized | 1435.351 | 8.639 | | |
| | | | 3.644 | 3402.854 |
| Phosphorous: | | | | |
| neutral | 2534.010 | 4.893 | | |
| ionized | 1182.755 | 10.484 | | |
| | | | 5.591 | 2218.021 |
| Arsenic: | | | | |
| neutral | 1890.500 | 6.559 | | |
| ionized | 1264.010 | 9.810 | | |
| | | | 3.251 | 3814.211 |

If further purification is required of the gas stream prior to the point at which silicon and boron ions are formed (namely when irradiated with monochromatic light whose wavelength is 3247.774 Å); then the gas stream can be first irradiated with monochromatic light whose wavelength is slightly less than 3722.61 Å. By doing so, any undesirable atomic or molecular species that can be ionized by 3722.61 Å light will be and can be removed from the gas stream by passing it through an electric and/or magnetic field located between the 3722.61 Å and 3247.774 Å light sources.

The ions, silicon and boron, are deposited on a negatively charged target where they form a crystal or crystals while picking up an electron and thus become neutral in a crystal lattice. The deposition process may proceed for as long as necessary to achieve the desired thickness.

Once the desired thickness of P layer has been deposited, the N layer is deposited on top of the P layer without the necessity of removing the substrate-P layer for inspection or polishing. Any one or combination of the N layer dopants can be used in forming the N layer with silicon as the matrix. The method and appartus employed is exactly the same as that described for forming the P layer using boron except that the wavelength of light used to form the ions is selected to correspond to the energy difference between the neutral excited and ionized states of the particular atoms being used.

One further refinement that is useful in producing the maximum purity of a particular atomic species is worth mentioning. Though a particular atom, silicon, is used for illustrative it will be appreciated that the refinement could be applied to any other atom as well, e.g. germanium, etc.

Once the silicon atom is formed in its excited neutral state other neutral excited atoms, of an unwanted sort, can also be formed. If these contaminant atoms can be ionized by 3247.774 Å light then they can be ionized along with the silicon. Therefore by irradiating all of the neutral excited atoms with another monochromatic light source whose wavelength corresponds to an energy slightly less than that required for the neutral excited silicon atoms to be ionized (3250 Å) neutral excited silicon atoms will proceed with the gas stream unchanged but the other neutral excited atoms that can be ionized will be and can be diverted out of the gas stream by application of an electric and/or magnetic field. It is also clear that any other neutral excited atoms as well as silicon will continue on with the gas stream that when the monochromatic light 3247.774 Å irradiates the stream only the neutral excited silicon atoms will be ionized and all other atoms will pass on with the gas stream. Thus the refinement under discussion provides an energy filter of approximately 3 Å such that those neutral excited atoms that can be ionized at energies lower than neutral excited silicon are ionized and those neutral excited atmos that require more energy to become ionized than neutral excited silicon never become ionized and pass on with the gas stream to waste or collection.

Four additional examples of the application of metastable gases to useful processes are presented below, namely:
(1) two laser metal purification application
(2) combustion application
(3) catalyst formation
(4) hydrocarbon cracking

EXAMPLE 3

Metal Purification with Two Lasers

A summary of this use can be briefly stated as follows: a gas such as helium is passed through an electric field such that a large concentration of the excited neutral form helium is created, referred to as metastable helium atoms; a volatile form of a selected metal, nonmetal or other molecule referred to as the reactant gas is introduced into the stream of helium metastable atoms whereby energy transfer from the mestastable atoms to the reactant gas atoms/molecules occurs, thus increasing the energy of the reactant molecules/atoms to an energy state referred to as a neutral excited state (the energy of which is less than that required to cause ionization of the reactant gas atoms/molecules; by irradiation of the neutral excited reactant gas atoms/molecules with light whose wavelength corresponds exactly to the energy difference between the excited neutral reactant species and the ionized reactant species, ionization occurs for those species in the reactant gas for which the sum of mestastable energy and the energy or the irradiation light equals or exceeds the ionization energy. Thus any impurity species in the reactant gas whose ionization energy requirement exceeds this sum will not be ionized and is therefore eliminated as a candidate for deposition in a thin film since deposition in this invention depends on ions. It is also clear that impurity species in the reactant gas whose ionization energy is less than this sum will be ionized along with the reactant and subsequently deposited in the thin film, and is thus regarded as an impurity. By reorganizing the method of application of this invention to the deposition films and extending the idea upon which the invention is based, it is possible to avoid the inclusion in the thin film of impurity species whose ionization energy requirement is less than or equal to the reactant species. The discussion below illustrates the method for a mixture of nickel, iron and tungsten where the objective is to make a thin film of nickel but one with no inclusions of iron or tungsten. Referring to Table 1 and bearing in mind the details of the invention, it is clear that once the metastable reactant gas of nickel has been formed along with those of the impurities, iron and tungsten, irradiation with 6316.9Å light will cause the ionization of the nickel and iron neutral excited species but will not cause ionization of the tungsten neutral excited species.

TABLE 1

|  | Neutral Excited (Å) eV | Ionized State (Å) eV | Difference in Energy (Å) eV |
|---|---|---|---|
| W (Tungsten) | 4008.8 3.093eV | 2204.5 5.625eV | 4897.3 2.532eV |
| Fe (Iron) | 3581.2Å 3.463eV | 2382.0Å 5.206eV | 7114.2Å 1.743eV |
| Ni (Nickel) | 3414.8Å 3.631eV | 2216.5Å 5.594eV | 6316.9Å 1.963eV |

Thus, after deposition the nickel thin film will be found to include only one of the two impurity species, that is iron but not tungsten. If, however, the neutral excited reactant specie and impurity species are first irradiated with light whose wavelength is greater than 6316.9Å the impurity species iron will be ionized but none of the rest. The iron ions can then be diverted, electrically or magnetically, from the reactant gas species (the nickel) and the only remaining impurity species, (that is the tungsten). The remaining mixture is then irradiated with light whose wavelength is less than or equal to 6316.9Å but greater than 4897.3Å thus forming nickel ions but not tungsten ions. In this way a reactant species whose ionization energy requirement is intermediate or between those of two impurity species can be separated and deposited as a thin film free from inclusions of impurities.

In actual form the process would be run as follows: By passing a 2 millmole/minute stream of helium, enclosed in a glass conduit, through two annular electrodes across which 300 Vdc is applied approximately $10^{14}$ metastable helium atoms per second are formed. The reactant gas (composed of gaseous reactant $Ni(CO)_6$ (nickel carbonyl) and two impurities $Fe(CO)_6$ and $W(CO)_6$, iron carbonyl and tungsten carbonyl respectively) is introduced into the helium metastable stream and mixed by turbulence and diffusion. The neutral excited states of each metal is formed by collisional energy transfer and/or Foster processes and helium is left in its neutral ground state. The reactant gas stream now containing the neutral excited species iron, nickel and tunsten, is conducted by pressure difference along the glass conduit to a point at which it is irradiated by light whose wavelength is greater than 6316.9Å (say 6500Å) whereupon the iron neutral excited species are ionized but not the nickel and tungsten neutral excited species. The ionized iron is attracted to a negatively charged target within the glass conduit and thereby eliminated from the reactant gas. The reactant gas stream now containing the neutral excited species nickel and tungsten only is conducted by pressure difference further along the glass conduit to a point at which it is irradiated by light whose wavelength is less than or equal to 6316.9Å but not less than or equal to 4897.3Å whereupon the nickel neutral excited species are ionized but not the tungsten neutral excited species. The ionized nickel is attracted to another negatively charged target within the glass conduit where it is deposited and forms a layer of nickel free from iron and tungsten, because the iron was previously eliminated as described above and the tungsten was never ionized and as such not deposited with the nickel.

EXAMPLE 4

Enhanced Combustion of Hydrocarbon Fuels

With this discussion we shall present an example of a new means by which the metastable gases nitrogen and oxygen can be employed to improve the efficiency with which hydrocarbon fuels can be burned. The efficiency of combustion is related to the amount of useful work that can be extracted from the combustion products. In the absence of the process/means to be described, an internal combustion engine uses 15 parts of air for every part of fuel; however, when the means to be described is employed with the internal combustion engine 33 parts of air for every part of fuel are consumed. Thus the efficiency of combustion is increased by a factor of 2.2.

The new means of combusting hydrocarbon fuels provide for:

(1) the production of more useful work per unit mass of fuel than current combustion methods (2) more complete combustion of fuel and therefore lower levels of polluting or harmful gases (i.e, NO, $NO_2$, CO, etc.) in the exhaust (3) the elimination of the need for costly pollution abatement equipment in automobiles (4) more cost effective use of fuel The new means of combustion on the fuel-oxidant mixture (i.e. $O_2$ in air) being passed through an electrostatic or magnetic field created by applying a DC voltage across two axially aligned annular electrodes that surround the channel through which the gas mixture passes on its way to the combustion chamber. The resulting gas mixture has a high concentration of "metastable" oxygen and nitrogen molecules. Because the physical nature of metastable atoms and/or molecules has been explained above, no further discussion of their physical nature will be presented; however, it is worth noting that the metastable atoms and/or molecules are not ions, hence the process does not depend on ionization or a plasma.

When metastable energy is collisionally transferred from either oxygen or nitrogen or both, to gas phase fuel and/or fuel aerosol (as a droplet) the increase in energy results in a reduction in the "activation energy" for combustion in the case of the vapor phase fuel molecules and an increase in vapor pressure of the fuel in the fuel aerosol particles. The last observation flows from the fact that liquid phase fuel does not burn but rather vapor phase fuel does burn. Thus in the case where the fuel is not well vaporized (i.e. in an aerosol), a substantial amount of heat derived from the combustion of gas phase fuel, is required to supply the heat of vaporization for the fuel droplets in the aerosol. The heat used to vaporize fuel droplets cannot be converted into work. When a fuel droplet in the aerosol receives additional energy such as collisionally transferred metastable energy an increase in the vapor pressure of the fuel aerosol droplet occurs due to the well accepted and widely used principle of thermodynamic equilibrium. Any open chemical system is constantly seeking the state of thermodynamic equilibrium because it is by definition the most stable state. Thermodynamic equilibrium is achieved by the re-distribution of excess energy into the electronic, translational, vibrational and rotational energy modes of the open chemical system. Thus if metastable energy is added to an aerosol fuel droplet it enters into the electronic mode of the system but as the system tends to thermodynamic equilibrium, the excess electronic energy is quickly (Ca $10^{-6}$ sec) redistributed into the translational vibrational and rotational modes. These are the energy modes that most influence the vapor pressure of the fuel droplet, in descending order of importance.

It is by both the reduction of the activation energy of combustion for gas phase fuel molecules and the increase in vapor pressure of the aerosol fuel droplets that the 2.2 factor increase in combustion efficiency is achieved.

The practical embodiment of this use is described in terms of an internal combustion 4-cycle engine, as in an automobile. The fuel air mixture used therein is conducted to each cylinder by the intake manifold. Opposite each intake port to which the intake manifold is connected mechanically, a conventional airtight electrical feed-through is located on said manifold. The electrical feed-through is insulated from the manifold. A one millimeter diameter metal rod is welded to the electrical connector on the inside of the manifold. The length of the rod is adjusted so that it does not interfere with the operation of the valve. The metal of the rod is selected to have a high electronic work function and to be inert. Tantalum was used in this example. To the exterior portion of the electrical connector, a positive connection to a 300 volt D.C. power supply is attached. The negative connector of the power supply is attached to the metal of the manifold. This completes the electrical circuit which includes the air gap between the tantalum metal rod and the interior metal surface of the manifold through which the hydrocarbon fuel-air mixture flows during operation. The power supply was selected to operate on a 12 volt D.C. input and to deliver 300 volts D.C. output at 10 watts of power.

As a result of this operation, increased power and decreased deleterious exhaust causes resulted, the exhaust gas being largely carbon dioxide and water vapor.

EXAMPLE 5

Catalyst Fabrication

Many industrial processes rely on catalysts such as the metals platinum, rhodium, silver, nickel, gold, iron, copper, zinc and others. Even alloys of some of these metals are used as catalysts. Even though any or all of the above catalysts could be formed by the method to be described, only the platinum catalyst will be considered in connection with the ammonia oxidation process for the formation of nitric acid.

A platinum gauze is used as the catalyst in the ammonia oxidation industrial process. The majority of the mass of the platinum gauze is provided to assure a mechanically stable physical structure and a large surface area. Due to the expense of the metal it would be desirable to produce a platinum coating on a much less expensive mechanical support.

Ordinarily, a catalyst is not consumed during the course of the reaction it initiates. However, in the case of the platinum gauze used in the ammonia oxidation process, the platinum appears to be consumed! The reason this occurs is that impurities in the platinum gauze react with ammonia or nitrous oxide or nitric acid but the platinum does not. The result is the physical erosion of the platinum gauze which leads to its disintegration and the need to replace it with fresh gauze. Thus if ultrapure platinum could be coated on to a mechanically stable high surface area substrate such as aluminum oxide ($Al_2O_3$), the catalyst would last idefinitely and be vastly less expensive. The process described below achieves that end.

The method employed is exactly the same as that described in item 3 above. However, the volatile form of platinum may be platinum hexafluoride ($PtF_6$) or Pt $(PF_3)_4$. The first light irradiation source would have a wavelength greater than 2858.8Å which would eliminate all impurities whose ionization energy requirement was less than that of platinum. The second light irradiation source would have a wavelength less than or equal to 2858.8Å although no more than 100Å less, which will cause the ionization of the platinum neutral excited species and no others. The second target could be $Al_2O_3$ or quartz wool to which a negative static charge is applied. Thus the platinum ions would be neutralized and simultaneously deposited onto the substrate building up a surface of desired thickness and of virtually 100% purity. The amount of platinum required would be 0.001% the mass of that required for the conventional platinum gauze catalyst and last 10 to 100 times longer.

EXAMPLE 6

By means of this example we will describe a new use relating to the production of petroleum products such as gasoline, jet fuel, fuel oil and the like from crude oil by a means not requiring a catalyst. Currently the case is that substantial amounts of costly cracking catalyst are required to produce petroleum products from crude oil in the majority of oil refining processes. The useful life-time of cracking catalysts ranges from a few hours to weeks, depending on the quality and chemical characteristics of the crude oil being refined. Further, the cost of a fresh catalyst charge for a medium size oil refinery can be as high as $400,000, according to Jim Hatten of the Texas Eastern Co. Thus it is clear that a new means of carrying out crude oil cracking that does not require an expensive catalyst could reduce production costs and therefore the consumer costs.

A brief description of the process is as follows:

So-called "cracking" of hydrocarbons is a non-technical way of referring or designating the rupture of a carbon-carbon bond in the hydrogen. The tendency of any chemical bond, such as a carbon-carbon bond, to precist can be expressed in terms of bond energy. Thus, in order to cause the rupture of such a bond requires at least the application of an acceptable form of energy to the bond to be ruptured and in an amount adequate to cause the desired rupture. Catalysts have been successfully put to this problem. Thus, catalysts have the means of reducing the tendency of the carbon-carbon bond to persist to the point or extent rupture occurs. Hence, catalyst "cracking" or crude oil to yield petroleum products can be thought of as a process whereby long chain hydrocarbons (crude oil) is broken up into short chain hydrocarbons (petroleum products) by means of a catalysts that causes the rupture of carbon-carbon bond in long chain hydrocarbons. The resulting mixture is then distilled in the normal or conventional way.

The new invention does not require catalyst use; however, a new means of providing the required energy for carbon-carbon bond rupture is central to the process. The energy source used is a metastable form of one or more of the fixed gases or inert gases such as nitrogen, argon, helium, neon, kryton. Because of the abundance of nitrogen, it is considered to be the preferred choice although the other gases work as well.

A mestastable gas molecule or atom is one that has excess energy in an amount sufficient to produce an excited state that is "metastable", i.e., relatively long lived (0010 milliseconds). When a large collection of metastable gas molecules exist they are referred to as a metastable gas. When such a gas is brought in contact, that is mixed, with hydrocarbons collision between the hydrocarbon molecules and mestastable molecules/atoms to the hydrocarbon molecules, the metastable species mentioned above all have sufficient energy to rupture the carbon-carbon bond in the host hydrocarbon molecule. The fate of the metastable gas molecule after energy transfer is that it returns to the ground state (i.e., state of minimum electronic, vibrational and rotational energy). Metastable gases are generated by passing a stream of ground state gas molecules/atoms through a DC potential gradient or by exposing the gas stream to a microwave field.

More specifically, in order to break a carbon-carbon chemical or covalent bond homolytically 84.4 Kcal per mol must be applied to the hydrocarbon. This amount of energy corresponds to 3.66 eV. The metastable energy of certain fixed and inert gases is shown in the table below.

TABLE I

| Atom/Molecule | Spectroscopy Notation | Metastable Energy in eV |
|---|---|---|
| He | $2^1S$ | 20.6 |
|  | $2^3S$ | 19.82 |
| Ne | $3P_0$ | 16.7 |
|  | $3P_2$ | 16.6 |
| Ar | $3P_0$ | 11.7 |
|  | $3P_2$ | 11.5 |
| Kr | $3P_0$ | 10.5 |
|  | $3P_2$ | 9.9 |
| Xe | $3P_0$ | 9.44 |
|  | $3P_1$ | 8.43 |
|  | $3P_2$ | 8.31 |
| $N_2(g)$ | $3\Sigma_v^+$ | 6.03 |

Thus by passing nitrogen gas through an annular pair of electrodes across which 200 volts DC is applied or through a microwave generator or magnetic field substantial amounts of metastable species of nitrogen are produced. The amount per unit time of metastable gas produced depends on the power applied to the electrical field or magnetic field or microwave field, as well as the flow rate of the ground state gas through the electromagnetic force (EMF) field. For example, a 200 VDC 5 watt EMF field is adequate to produce $6 \times 10^{23}$ metastable atoms/molecules per 10 min. Because the production of metastable atoms/molecules is physically similar to an optical absorption process which depends on instantaneous concentration of ground state gas in the field, scale-up is readily feasible. Thus, petroleum products are formed at a rate equal to that of the production of metastable gas molecules diminished by losses to the walls and recombination processes. The estimated loss is less than 10%!.

With crude oil in the vapor phase such as the fluidized bed cracker combination with a metastable gas of the type described above, it is straightforward, where a 50—50 ratio of metastable gas to crude oil vapor is maintained by means of concentric annular jets.

Experimental evidence of the principle was obtained using a long chain hydrocarbon, n-decane. When n-decane vapor was mixed with nitrogen gas metastable molecules by means of a concentric annular jet the following products were obtained:

TABLE II

| Carbon #[a] | Relative % |
|---|---|
| 1–6 | 41 |
| 7 | 4.3 |
| 8 | 13.4 |
| 9 | 10.7 |
| 10 | 6.7 |
| 11 | 13. |
| 12 | 5.7 |

[a]includes isomers

Thus it is clear hydrocarbon cracking can be promoted as described.

Other preferred applications envisoned for this invention are:
(1) catalyst metals deposited on inexpensive substrates.
(2) microelectronic units or components (diodes, transistors and the like)
(3) metal or polymer coatings to retard or prohibit corrosion and/or wear
(4) special optical surfaces and crystals
(5) low cost conductors
(6) high purity materials of any kind
(7) to replace any high temperature epitaxial process
(8) to separate in relatively pure form any difficulty separable elements, including but not limited to the rare earth elements, metals of the platinum group, rare gases such as argon, neon, etc., hydrogen, helium or other gases, atmospheric gases generally, and the halogens
(9) to carry out any chemical reaction in which the injection of specific energy types is helpful.

Although many variations may be contemplated within the scope of the invention we intend to be limited only by the following Patent Claims:

We claim:
1. The process for cracking hydrocarbons which comprises forming a metastable reagent gas, intermingling the same with hydrocarbon vapor, to cause the rupture of carbon-to-carbon bonds in the molecules of said hydrocarbon vapor to produce an improved hydrocarbon mixture.

* * * * *